United States Patent
Park et al.

(10) Patent No.: US 10,192,686 B1
(45) Date of Patent: Jan. 29, 2019

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Gu Won Ji, Suwon-si (KR); Se Hun Park, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/879,827

(22) Filed: Jan. 25, 2018

(30) Foreign Application Priority Data

Sep. 20, 2017 (KR) .................. 10-2017-0121210

(51) Int. Cl.
*H05K 1/18* (2006.01)
*H01G 4/30* (2006.01)
*H05K 1/02* (2006.01)
*H01G 4/232* (2006.01)

(52) U.S. Cl.
CPC ............... *H01G 4/30* (2013.01); *H01G 4/232* (2013.01); *H05K 1/0231* (2013.01)

(58) Field of Classification Search
CPC .. H05K 1/02; H05K 1/14; H05K 1/18; H05K 7/00; H05K 7/02; H01G 2/06; H01G 4/12; H01G 4/30
USPC ...... 174/260, 255, 258; 361/301.4, 768, 782
See application file for complete search history.

(56) References Cited

U.S. PATENT DOCUMENTS

| | | | | |
|---|---|---|---|---|
| 9,648,746 B2* | 5/2017 | Park | ................. | H05K 1/181 |
| 9,655,246 B2* | 5/2017 | Mori | ................. | H05K 1/181 |
| 9,824,824 B2* | 11/2017 | Park | ................. | H01G 4/248 |
| 2010/0188798 A1 | 7/2010 | Togashi et al. | | |
| 2013/0033836 A1* | 2/2013 | Hattori | ................. | H01G 4/30 361/768 |
| 2013/0329389 A1* | 12/2013 | Hattori | ................. | H05K 1/0216 361/782 |

(Continued)

FOREIGN PATENT DOCUMENTS

JP 3847265 B2 11/2006
JP 2012-204572 A 10/2012

(Continued)

*Primary Examiner* — Xiaoliang Chen
(74) *Attorney, Agent, or Firm* — McDermott Will & Emery LLP

(57) ABSTRACT

There are provided a multilayer electronic component and a board having the same. The multilayer electronic component includes: a capacitor body; external electrodes including band portions and connected portions; connection terminals formed of insulators and disposed on the band portions; and insulating portions disposed on at least some circumferential surfaces of the connection terminals. The connection terminals include conductive patterns formed on surfaces thereof facing the band portions and surfaces thereof opposing the surfaces, cut portions are formed in some the circumferential surfaces connecting between the conductive patterns facing each other, connection patterns are formed on the cut portions to electrically connect between the conductive patterns facing each other, and the insulating portions are disposed so as not to cover the cut portions.

13 Claims, 13 Drawing Sheets

(56) References Cited

U.S. PATENT DOCUMENTS

| | | | |
|---|---|---|---|
| 2014/0016242 A1 | 1/2014 | Hattori et al. | |
| 2014/0268487 A1* | 9/2014 | Yoshida | H01G 2/065 361/301.4 |
| 2015/0131253 A1* | 5/2015 | Park | H01G 2/06 361/782 |
| 2015/0270065 A1* | 9/2015 | Hattori | H01G 2/065 174/255 |
| 2015/0270068 A1* | 9/2015 | Hattori | H01G 4/30 361/301.4 |
| 2016/0007446 A1* | 1/2016 | Ishikawa | H05K 1/113 174/260 |
| 2016/0088733 A1* | 3/2016 | Lee | H05K 3/3442 361/768 |

FOREIGN PATENT DOCUMENTS

| | | |
|---|---|---|
| KR | 10-2010-0087622 A | 8/2010 |
| KR | 10-2015-0127965 A | 11/2015 |

* cited by examiner

MULTILAYER ELECTRONIC COMPONENT AND BOARD HAVING THE SAME

CROSS-REFERENCE TO RELATED APPLICATION(S)

This application claims benefit of priority to Korean Patent Application No. 10-2017-0121210 filed on Sep. 20, 2017 in the Korean Intellectual Property Office, the disclosure of which is incorporated herein by reference in its entirety.

TECHNICAL FIELD

The present disclosure relates to a multilayer electronic component and a board including the same.

BACKGROUND

A multilayer capacitor, a multilayer electronic component, is formed of a dielectric material, and such a dielectric material may have piezoelectric properties, to thus be synchronized and deformed with a voltage applied thereto.

When a frequency of the applied voltage is within an audio frequency band, displacement of the dielectric material becomes vibrations which may be transferred to a circuit board through solders, and vibrations of the circuit board are thus heard as sound. Such sound is known as acoustic noise.

In a case in which a device is operated in a silent environment, a user may recognize the acoustic noise as abnormal noise and may believe that a fault has occurred in the device. In addition, in a device having an audio circuit, acoustic noise may overlap an audio output, such that quality of the device may be deteriorated.

In addition, in a case in which piezoelectric vibrations of the multilayer capacitor are generated in a high frequency region of 20 kHz or more, separately from the acoustic noise experienced by a user, malfunctioning of various sensors used in information technology (IT) and industrial/electrical component fields may be caused.

Meanwhile, external electrodes of the multilayer capacitor and the circuit board are connected to each other by solders. In this case, the solders are formed in an inclined state at a predetermined height along surfaces of the external electrodes on opposite side surfaces or opposite end surfaces of a capacitor body.

Here, as a volume and a height of the solders are increased, the vibrations of the multilayer capacitor are more easily transferred to the circuit board, such that a magnitude of the generated acoustic noise is increased.

SUMMARY

An aspect of the present disclosure may provide a multilayer electronic component of which acoustic noise in an audio frequency region of 20 kHz or less and high frequency vibrations in a high frequency region of 20 kHz or more may be reduced, and a board having the same.

According to an aspect of the present disclosure, a multilayer electronic component may include: a capacitor body including a plurality of dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, one ends of the first and second internal electrodes being exposed through the third and fourth surfaces, respectively; first and second external electrodes including, respectively, first and second band portions disposed on the first surface of the capacitor body to be spaced apart from each other and first and second connected portions, respectively extending from the first and second band portions to the third and fourth surfaces of the capacitor body; first and second connection terminals formed of insulators and disposed on the first and second band portions, respectively; and first and second insulating portions disposed on at least some circumferential surfaces of the first and second connection terminals, respectively. The first connection terminal may include a first conductive pattern formed on a surface thereof facing the first band portion, a second conductive pattern formed on a surface thereof opposing the surface on which the first conductive pattern is formed, a first cut portion formed in some circumferential surfaces thereof connecting the first and second conductive patterns to each other, and a first connection pattern formed on the first cut portion to electrically connect the first and second conductive patterns to each other. The second connection terminal may include a third conductive pattern formed on a surface thereof facing the second band portion, a fourth conductive pattern formed on a surface thereof opposing the surface on which the third conductive pattern is formed, a second cut portion formed in some circumferential surfaces thereof connecting the third and fourth conductive patterns to each other, and a second connection pattern formed on the second cut portion to electrically connect the third and fourth conductive patterns to each other.

The first and second insulating portions may be disposed so as not to cover the first and second cut portions, respectively.

Areas of the first and third conductive patterns may be smaller than those of the first and second band portions, respectively.

The first connection pattern may be formed on all of the circumferential surfaces of the first connection terminal connecting the first and second conductive patterns to each other or some the circumferential surfaces of the first connection terminal including the first cut portion, and the second connection pattern may be formed on all of the circumferential surfaces of the second connection terminal connecting the third and fourth conductive patterns to each other or some the circumferential surfaces of the second connection terminal including the second cut portion.

First and second solder accommodating portions may be provided by the first and second cut portions on the first and second band portions, respectively.

The first and second cut portions may be open toward the third and fourth surfaces of the capacitor body, respectively.

The first and second cut portions may be further formed to be open toward at least one of the fifth and sixth surfaces of the capacitor body.

The first and second insulating portions may be disposed on surfaces of the first and second connection terminals opposing the first and second cut portions, respectively.

The first and second insulating portions may be disposed on surfaces of the first and second connection terminals toward the fourth and third surfaces of the capacitor body, respectively.

The first and second insulating portions may be disposed on surfaces of the first and second connection terminals toward the fifth and sixth surfaces of the capacitor body.

The first insulating portions may be formed on both sides of a surface of the first connection terminal toward the third surface of the capacitor body with the first cut portion interposed therebetween, and the second insulating portions may be formed on both sides of a surface of the second connection terminal toward the fourth surface of the capacitor body with the second cut portion interposed therebetween.

According to another aspect of the present disclosure, a board having a multilayer electronic component may include: a circuit board having first and second electrode pads disposed on one surface thereof; and the multilayer electronic component as described above mounted on the circuit board so that the second and fourth conductive patterns of the first and second connection terminals are connected to the first and second electrode pads, respectively.

The board may further include a first solder filling a first solder pocket confined by the capacitor body, the first cut portion of the first connection terminal, and the circuit board, and a second solder filling a second solder pocket confined by the capacitor body, the second cut portion of the second connection terminal, and the circuit board.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Figure 1:
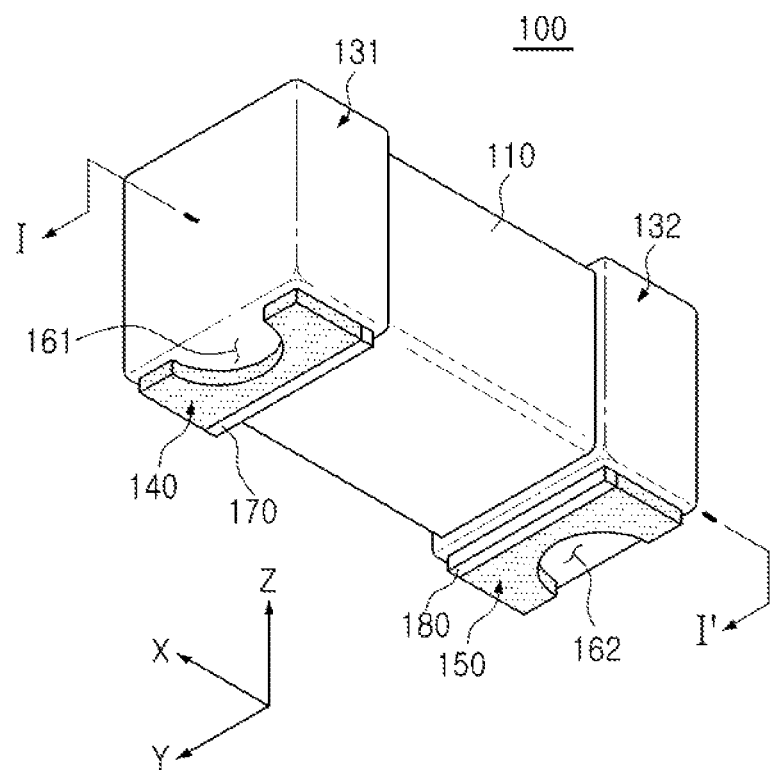
FIG. 1 is a perspective view illustrating a multilayer electronic component according to an exemplary embodiment in the present disclosure.
Figure 2:
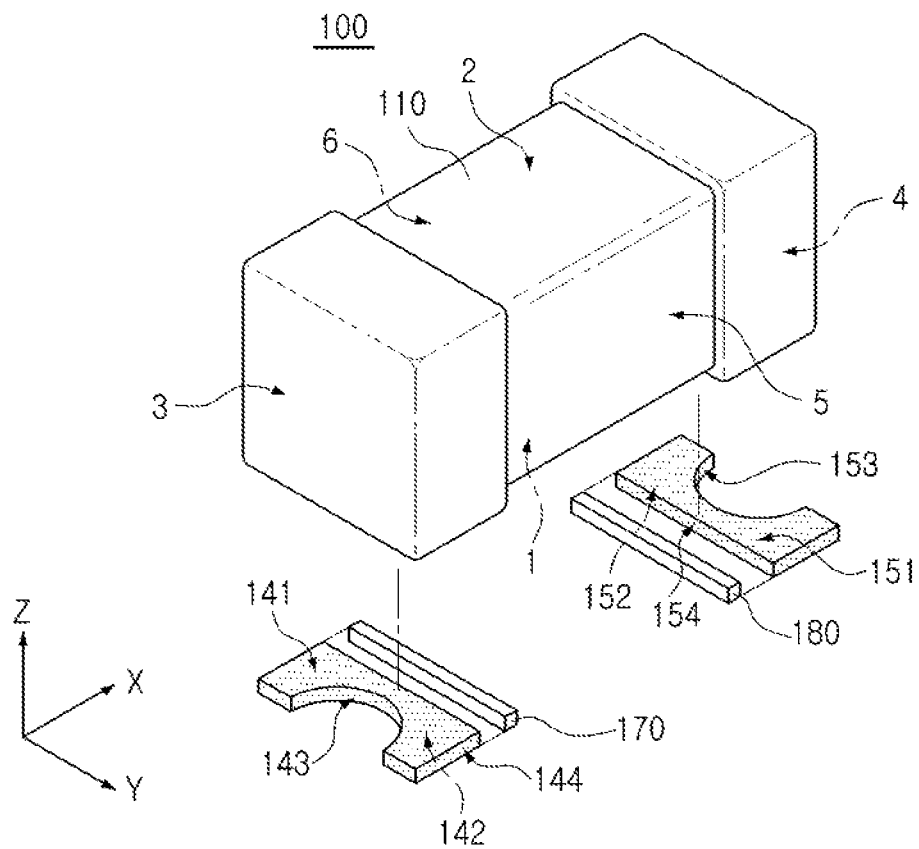
FIG. 2 is an exploded perspective view illustrating the multilayer electronic component of FIG. 1 from which first and second connection terminals and first and second insulating portions are separated.
Figure 3A:
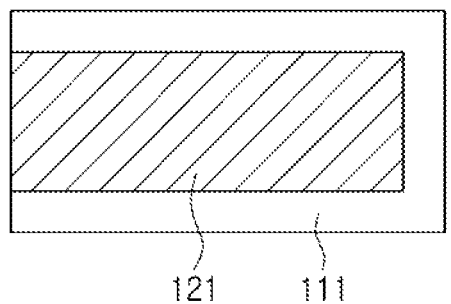
FIGS. 3A and 3B are plan views illustrating, respectively, first and second internal electrodes of the multilayer electronic component according to an exemplary embodiment in the present disclosure.
Figure 3B:
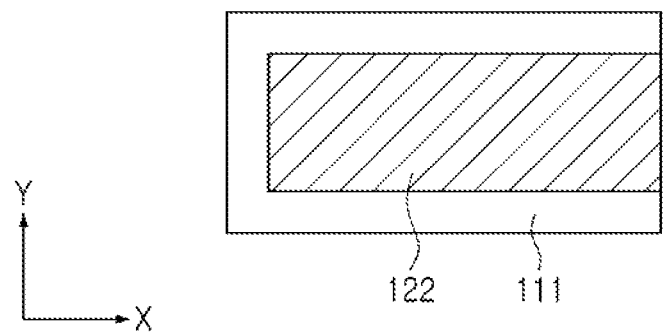
Figure 4:
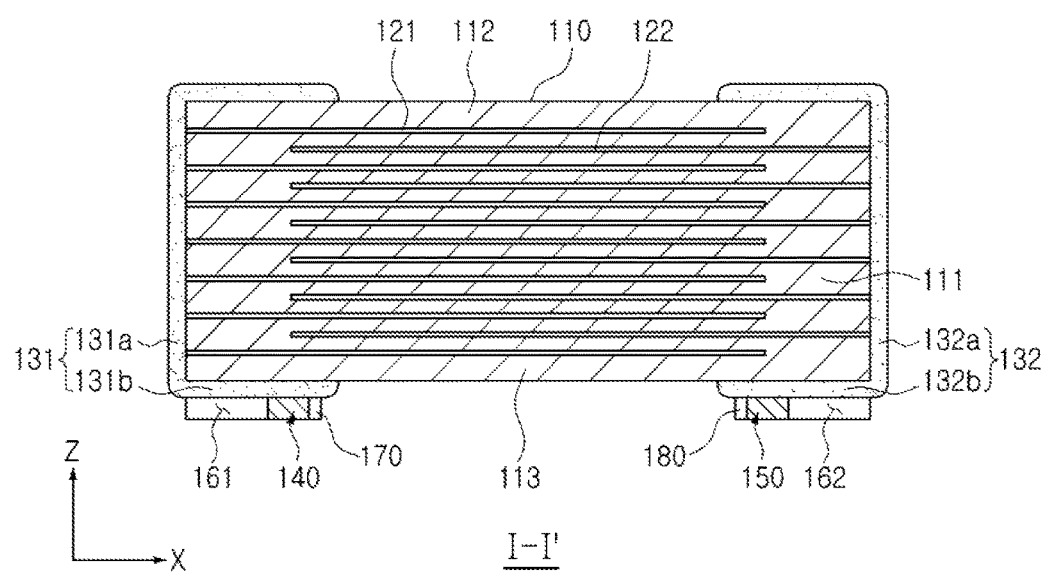
FIG. 4 is a cross-sectional view taken along line I-I' of FIG. 1.

FIG. 1 is a perspective view illustrating a multilayer electronic component according to an exemplary embodiment in the present disclosure, FIG. 2 is an exploded perspective view illustrating the multilayer electronic component of FIG. 1 from which first and second connection terminals and first and second insulating portions are separated, FIGS. 3A and 3B are plan views illustrating, respectively, first and second internal electrodes of the multilayer electronic component according to an exemplary embodiment in the present disclosure, and FIG. 4 is a cross-sectional view taken along line I-I' of FIG. 1.

Referring to FIGS. 1 through 4, a multilayer electronic component 100 according to an exemplary embodiment in the present disclosure may include a capacitor body 110, first and second external electrodes 131 and 132 disposed on a mounting surface of the capacitor body 110 to be spaced apart from each other, first and second connection terminals 140 and 150 formed of insulators and disposed to be connected to the first and second external electrodes 131 and 132, respectively, and first and second insulating portions 170 and 180 disposed on at least some circumferential surfaces of the first and second connection terminals 140 and 150, respectively.

Hereinafter, directions of the capacitor body 110 will be defined in order to clearly describe exemplary embodiments in the present disclosure. X, Y and Z in the drawings refer to a length direction, a width direction, and a thickness direction of the capacitor body 110, respectively. In addition, in the present exemplary embodiment, the thickness direction refers to a stacking direction in which dielectric layers are stacked.

The capacitor body 110 may be formed by stacking and then sintering a plurality of dielectric layers 111 in the Z direction, and may include the plurality of dielectric layers 111 and a plurality of first and second internal electrodes 121 and 122 alternately disposed in the Z direction with respective dielectric layers 111 interposed therebetween.

In addition, covers 112 and 113 having a predetermined thickness may be formed, respectively, on both sides of the capacitor body 110 in the Z direction.

Here, the respective adjacent dielectric layers 111 of the capacitor body 110 may be integrated with each other so that boundaries therebetween are not readily apparent.

The capacitor body 110 may have a substantially hexahedral shape. However, a shape of the capacitor body 110 is not limited thereto.

In the present exemplary embodiment, for convenience of explanation, first and second surfaces 1 and 2 of the capacitor body 110 refer to opposite surfaces of the capacitor body 110 opposing each other in the Z direction, third and fourth surfaces 3 and 4 of the capacitor body 110 refer to opposite surfaces of the capacitor body 110 connected to the first and second surfaces 1 and 2 and opposing each other in the X direction, and fifth and sixth surfaces 5 and 6 of the capacitor body 110 refer to opposite surfaces of the capacitor body 110 connected to the first and second surfaces 1 and 2, connected to the third and fourth surfaces 3 and 4, and opposing each other in the Y direction. In the present exemplary embodiment, the first surface 1 may be a mounting surface.

In addition, the dielectric layer 111 may include a ceramic material having a high dielectric constant, for example, a barium titanate ($BaTiO_3$) based ceramic powder, or the like. However, a material of the dielectric layer 111 is not limited thereto.

An example of the barium titanate ($BaTiO_3$) based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr, or the like, is partially dissolved in $BaTiO_3$. However, an example of the barium titanate ($BaTiO_3$) based ceramic powder is not limited thereto.

In addition, the dielectric layer 111 may further include a ceramic additive, an organic solvent, a plasticizer, a binder, a dispersant, and the like, in addition to the ceramic powder.

As the ceramic additive, for example, a transition metal oxide or a transition metal carbide, a rare earth element, magnesium (Mg), aluminum (Al), or the like, may be used.

The first and second internal electrodes 121 and 122, which are electrodes having different polarities, may be alternately disposed to face each other in the Z direction with respective dielectric layers 111 interposed therebetween, and one ends of the first and second internal electrodes 121 and 122 may be exposed through the third and fourth surfaces 3 and 4 of the capacitor body 110, respectively.

Here, the first and second internal electrodes 121 and 122 may be electrically insulated from each other by the dielectric layer 111 disposed therebetween.

The end portions of the first and second internal electrodes 121 and 122 alternately exposed through the third and fourth surfaces 3 and 4 of the capacitor body 110, respectively, may be electrically connected to portions of first and second external electrodes 131 and 132 disposed on third and fourth surfaces 3 and 4 of a capacitor body 110 to be described below, respectively.

Here, the first and second internal electrodes 121 and 122 may be formed of a conductive metal, for example, a material such as nickel (Ni), a nickel (Ni) alloy, or the like. However, materials of the first and second internal electrodes 121 and 122 are not limited thereto.

According to the configuration described above, when predetermined voltages are applied to the first and second external electrodes 131 and 132, electric charges may be accumulated between the first and second internal electrodes 121 and 122 facing each other.

Here, a capacitance of the multilayer electronic component 100 may be in proportion to an area at which the first and second internal electrodes 121 and 122 overlap each other in the Z direction.

Voltages having different polarities may be provided to the first and second external electrodes 131 and 132, respectively, and the first and second external electrodes 131 and 132 may be electrically connected to the exposed portions of the first and second internal electrodes 121 and 122, respectively.

Plating layers may be formed on surfaces of the first and second external electrodes 131 and 132, if necessary.

For example, the first and second external electrodes 131 and 132 may include conductive layers, nickel (Ni) plating layers formed on the conductive layers, and tin (Sn) plating layers formed on the nickel plating layers, respectively.

The first external electrode 131 may include a first connected portion 131a and a first band portion 131b.

The first band portion 131b may be disposed on a portion of the first surface 1 of the capacitor body 110, and may be connected to the first connection terminal 140.

The first connected portion 131a may extend from the first band portion 131b to the third surface 3 of the capacitor body 110, and may be connected to the first internal electrodes 121 exposed through the third surface 3 of the capacitor body 110.

Here, the first band portion 131b may also be formed on a portion of the second surface 2 of the capacitor body 110 and portions of the fifth and sixth surfaces 5 and 6 of the capacitor body 110, if necessary, in order to improve adhesion strength, or the like.

The second external electrode 132 may include a second connected portion 132a and a second band portion 132b.

The second band portion 132b may be disposed on the first surface 1 of the capacitor body 110 to be spaced apart from the first band portion 131b, and may be connected to the second connection terminal 150.

The second connected portion 132a may extend from the second band portion 132b to the fourth surface 4 of the capacitor body 110, and may be connected to the second internal electrodes 122 exposed through the fourth surface 4 of the capacitor body 110.

Here, the second band portion 132b may also be formed on a portion of the second surface 2 of the capacitor body 110 and portions of the fifth and sixth surfaces 5 and 6 of the capacitor body 110, if necessary, in order to improve adhesion strength, or the like.

The first connection terminal 140 may be formed of the insulator, be disposed on the first band portion 131b, and may include first and second conductive patterns 141 and 142 formed of a conductive metal.

For example, the first connection terminal 140 may include an insulating substrate or a circuit board such as FR4, a flexible printed circuit board (FPCB), but is not limited thereto.

The first conductive pattern 141 may be formed on a surface of the first connection terminal 140 facing the first band portion 131b of the first external electrode 131, and the second conductive pattern 142 may be formed on a surface of the first connection terminal 140 opposing the surface of the first connection terminal 140 on which the first conductive pattern 141 is formed, in the Z direction.

In addition, a first cut portion 143 may be formed in some circumferential surfaces of the first connection terminal 140 connecting between two surfaces on which the first and second conductive patterns 141 and 142 are formed, respectively.

Therefore, a first solder accommodating portion 161 may be provided as a solder pocket on the first band portion 131b of the first external electrode 131 on the first surface 1 of the capacitor body 110.

In the present exemplary embodiment, the first cut portion 143 may be formed to be open toward the third surface 3 of the capacitor body 110 in the X direction. Here, the first cut portion 143 may have a curved surface, but is not limited thereto.

In addition, the first connection terminal 140 may include a first connection pattern formed of a conductive metal disposed on the first cut portion 143 and electrically connecting the first and second conductive patterns 141 and 142 to each other. Since the first connection pattern indicates the same portion as the first cut portion, the first connection pattern will hereinafter be denoted by reference numeral 143, which denotes the first cut portion. Here, the first connection pattern 143 may be formed of a plating layer.

The second connection terminal 150 may be formed of the insulator, be disposed on the second band portion 132b, and may include third and fourth conductive patterns 151 and 152 formed of a conductive metal.

For example, the second connection terminal 150 may include an insulating substrate or a circuit board such as FR4, an FPCB, but is not limited thereto.

The third conductive pattern 151 may be formed on a surface of the second connection terminal 150 facing the second band portion 132b of the second external electrode 132, and the fourth conductive pattern 152 may be formed on a surface of the second connection terminal 150 opposing the surface of the second connection terminal on which the third conductive pattern 151 is formed, in the Z direction.

In addition, a second cut portion 153 may be formed in some circumferential surfaces of the second connection terminal 150 connecting between two surfaces on which the third and fourth conductive patterns 151 and 152 are formed, respectively.

Therefore, a second solder accommodating portion 162 may be provided as a solder pocket on the second band portion 132*b* of the second external electrode 132 on the first surface 1 of the capacitor body 110.

In the present exemplary embodiment, the second cut portion 153 may be formed to be open toward the fourth surface 4 of the capacitor body 110 in the X direction. Here, the second cut portion 153 may have a curved surface, but is not limited thereto.

In addition, the second connection terminal 150 may include a second connection pattern formed of a conductive metal disposed on the second cut portion 153 and electrically connecting the third and fourth conductive patterns 151 and 152 to each other. Since the second connection pattern indicates the same portion as the second cut portion, the second connection pattern will hereinafter be denoted by reference numeral 153, which denotes the second cut portion. Here, the second connection pattern 153 may be formed of a plating layer.

Meanwhile, areas of X-Y cross sections of the first and second connection terminals 140 and 150 may be smaller than areas of the first and second band portions 131*b* and 132*b*, respectively.

That is, sizes of the first and third conductive patterns 141 and 151 may be smaller than those of the first band portion 131*b* of the first external electrode 131 and the second band portion 132*b* of the second external electrode 132, respectively.

Meanwhile, the first connection terminal 140 may include connection patterns further formed on the other surfaces 144 of the first connection terminal other than the first cut portion 143 among the circumferential surfaces of the first connection terminal connecting the first and second conductive patterns 141 and 142 to each other, such that all of the circumferential surfaces of the first connection terminal 140 or some the circumferential surfaces of the first connection terminal 140 including the first cut portion 143 may become the first connection patterns.

In addition, the second connection terminal 150 may include connection patterns further formed on the other surfaces 154 of the second connection terminal other than the second cut portion 153 among the circumferential surfaces of the second connection terminal connecting the third and fourth conductive patterns 151 and 152 to each other, such that all of the circumferential surfaces of the second connection terminal 150 or some the circumferential surfaces of the second connection terminal 150 including the second cut portion 153 may become the second connection patterns.

When the first and second connection patterns are additionally formed on all or some the circumferential surfaces of the first and second connection terminals 140 and 150, respectively, as described above, soldering is not only performed on inner portions of the first and second cut portions 143 and 153, but may be performed on the circumferential surfaces of the first and second connection terminals except for the first and second cut portions 143 and 153 to suppress a misalignment level in a position between the multilayer electronic component and a circuit board at the time of mounting the multilayer electronic component on the circuit board. In addition, bonding areas between the multilayer electronic component and solders may be increased at the time of performing solder bonding to improve adhesion strength of the multilayer electronic component.

The first and second connection terminals 140 and 150 may allow the capacitor body 110 to be spaced apart from the circuit board by a predetermined distance to thus suppress piezoelectric vibrations generated by the capacitor body 110 from being introduced into the circuit board.

Such an effect may be improved when thicknesses of the first and second connection terminals 140 and 150 are a predetermined thickness or more, and the thicknesses of the first and second connection terminals 140 and 150 may be, for example, 60 μm or more, but are not limited thereto.

In addition, the first and second connection terminals 140 and 150 may include plating layers, if necessary.

The plating layers may include nickel (Ni) plating layers formed on the first to fourth conductive patterns 141, 142, 151, and 152 of the first and second connection terminals 140 and 150 and the first and second connection patterns 143 and 153 and tin (Sn) plating layers formed on the nickel plating layers.

The first and second insulating portions 170 and 180 may be disposed on the first and second connection terminals 140 and 150, respectively, so as not to cover the first and second cut portions 143 and 153, respectively.

For example, the first and second insulating portions 170 and 180 may be disposed on surfaces of the first and second connection terminals 140 and 150 opposing the first and second cut portions 143 and 153, respectively.

In the present exemplary embodiment, the first insulating portion 170 may be formed on one surface of the first connection terminal 140 toward the fourth surface 4 of the capacitor body 110 in the X direction.

In this case, the first insulating portion 170 may be formed on the entirety of one surface of the first connection terminal 140 toward the fourth surface 4 of the capacitor body 110, but may only be formed on a portion of one surface of the first connection terminal 140 toward the fourth surface 4 of the capacitor body 110, if necessary.

The second insulating portion 180 may be formed on one surface of the second connection terminal 150 toward the third surface 3 of the capacitor body 110 in the X direction.

In this case, the second insulating portion 180 may be formed on the entirety of one surface of the second connection terminal 150 toward the third surface 3 of the capacitor body 110, but may only be formed on a portion of one surface of the second connection terminal 150 toward the third surface 3 of the capacitor body 110, if necessary.

As in the present exemplary embodiment, when the first and second cut portions 143 and 153 are formed to opposing each other in the X direction and the first and second insulating portions 170 and 180 are disposed to face each other in the X direction, a spacing distance for insulation between the first and second connection terminals 140 and 150 may be maintained to prevent the generation of a short-circuit in the multilayer electronic component. Particularly, such a role for preventing short-circuits may be more effective in a multilayer electronic component having a small size.

Here, lengths of the first and second insulating portions 170 and 180 in the X direction may be appropriately adjusted in consideration of adhesion strength of the first and second connection terminals 140 and 150, respectively.

Meanwhile, positions of the first and second insulating portions according to the present disclosure may be variously modified. For example, the first and second insulating portions may be further formed on the other surfaces of the circumferential surfaces of the first and second connection terminals.

Areas and positions of the insulating portions may be changed or added to adjust bonding areas of solders, resulting in improvement of an acoustic noise reducing effect of the multilayer electronic component.

For example, in a multilayer electronic component having a large size, basically, external electrodes may be manufactured at a large size. Therefore, bonding areas between connection terminals and the external electrodes may be sufficiently secured, such that a predetermined level of adhesion strength, or more, may be secured.

Therefore, the bonding areas between the external electrodes and the connection terminals may be reduced by reducing the areas of the insulating portions or adjusting the positions of the insulating portions in the X or Y direction. Therefore, areas to which piezoelectric vibrations are transferred may be reduced to further suppress acoustic noise of the multilayer electronic component.

Figure 5:
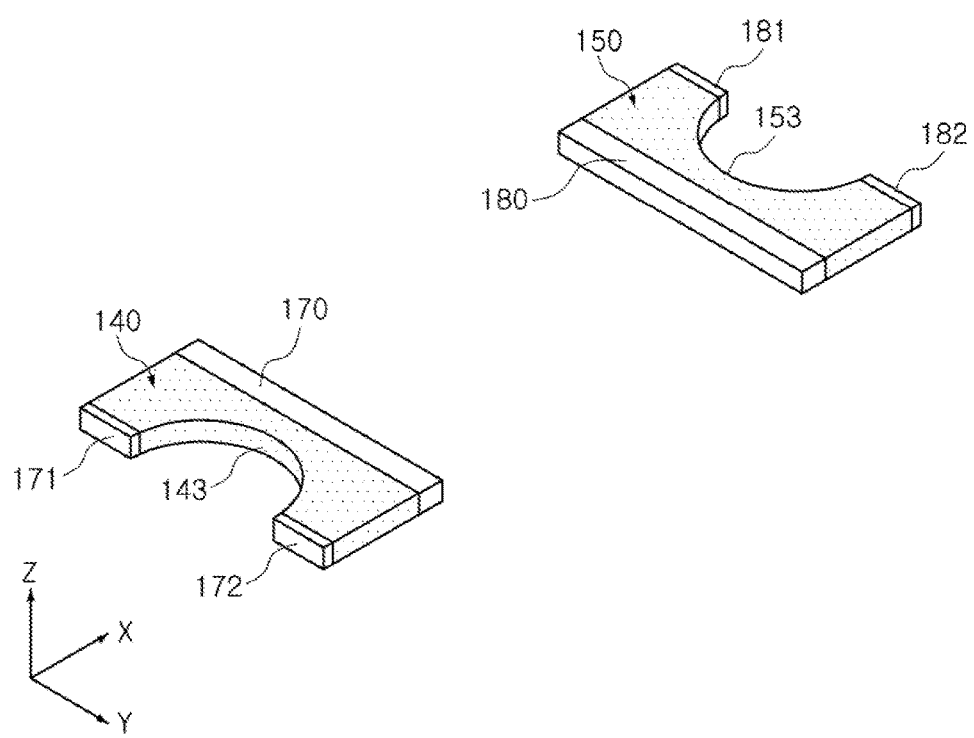
FIGS. 5 through 11 are perspective views illustrating various modified examples of first and second insulating portions according to the present disclosure.

For example, as illustrated in FIG. 5, a pair of first insulating portions 171 and 172 may be further formed on both sides of a surface of the first connection terminal 140 toward the third surface 3 of the capacitor body 110 in the X direction with the first cut portion 143 interposed therebetween.

In addition, a pair of second insulating portions 181 and 182 may be further formed on both sides of a surface of the second connection terminal 150 toward the fourth surface 4 of the capacitor body 110 in the X direction with the second cut portion 153 interposed therebetween.

Figure 6:
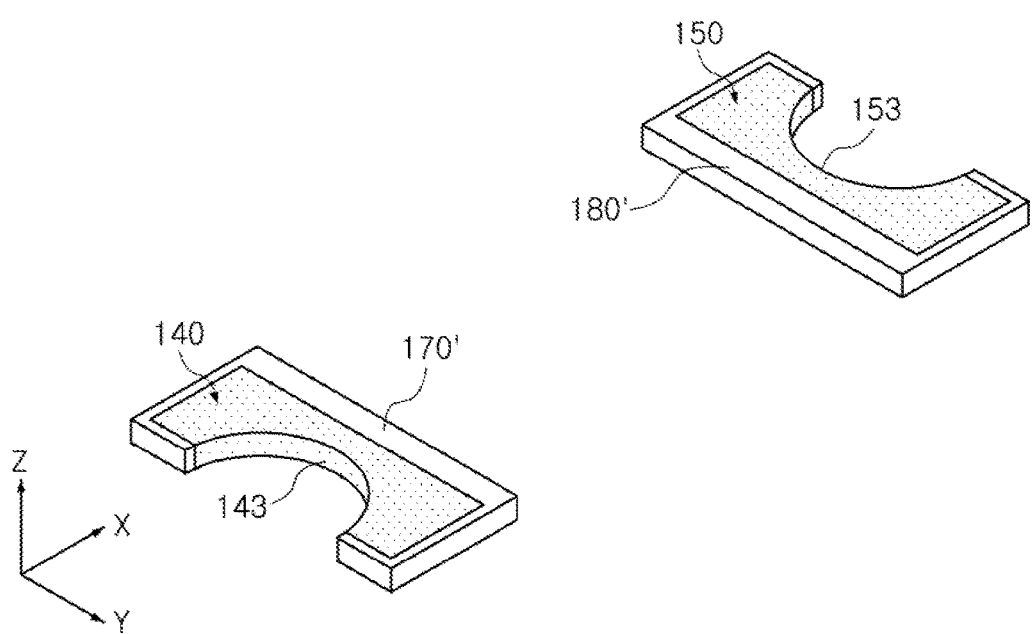

As illustrated in FIG. 6, a first insulating portion 170' may be formed on all of a surface of the first connection terminal 140 toward the fourth surface 4 of the capacitor body 110 in the X direction, both sides of a surface of the first connection terminal 140 toward the third surface 3 of the capacitor body 110 in the X direction with the first cut portion 143 interposed therebetween, and opposite surfaces of the first connection terminal 140 in the Y direction.

That is, the first insulating portion 170' may cover all circumferential surfaces of the first connection terminal 140 except for the first cut portion 143 of the first connection terminal 140.

In addition, a second insulating portion 180' may be formed on all of a surface of the second connection terminal 150 toward the third surface 3 of the capacitor body 110 in the X direction, both sides of a surface of the second connection terminal 150 toward the fourth surface 4 of the capacitor body 110 in the X direction with the second cut portion 153 interposed therebetween, and opposite surfaces of the second connection terminal 150 in the Y direction.

That is, the second insulating portion 180' may cover all circumferential surfaces of the second connection terminal 150 except for the second cut portion 153 of the second connection terminal 150.

Figure 7:
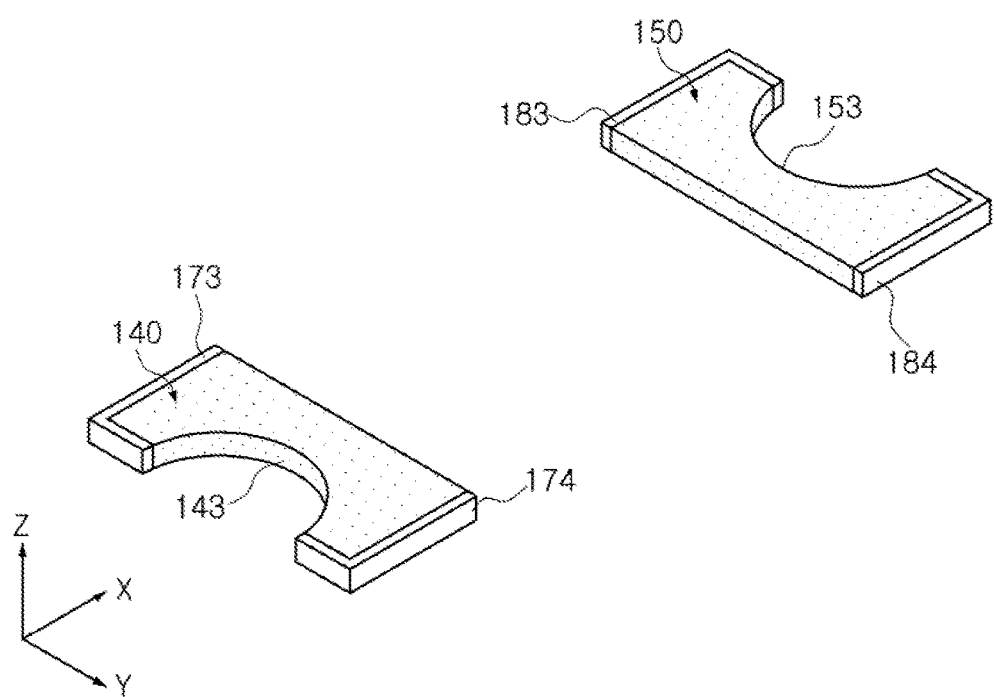

As illustrated in FIG. 7, first insulating portions 173 and 174 may be further formed on both sides of a surface of the first connection terminal 140 toward the third surface 3 of the capacitor body 110 in the X direction with the first cut portion 143 interposed therebetween, and opposite surfaces of the first connection terminal 140 in the Y direction.

That is, the first insulating portions 173 and 174 may cover surfaces of the first connection terminal 140 except for the first cut portion 143 and a surface opposing the first cut portion 143 among the circumferential surfaces of the first connection terminal 140.

In addition, second insulating portions 183 and 184 may be formed on both sides of a surface of the second connection terminal 150 toward the fourth surface 4 of the capacitor body 110 in the X direction with the second cut portion 153 interposed therebetween, and opposite surfaces of the second connection terminal 150 in the Y direction.

That is, the second insulating portions 183 and 184 may cover surfaces of the second connection terminal 150 except for the second cut portion 153 and a surface opposing the second cut portion 153 among the circumferential surfaces of the second connection terminal 150.

Figure 8:
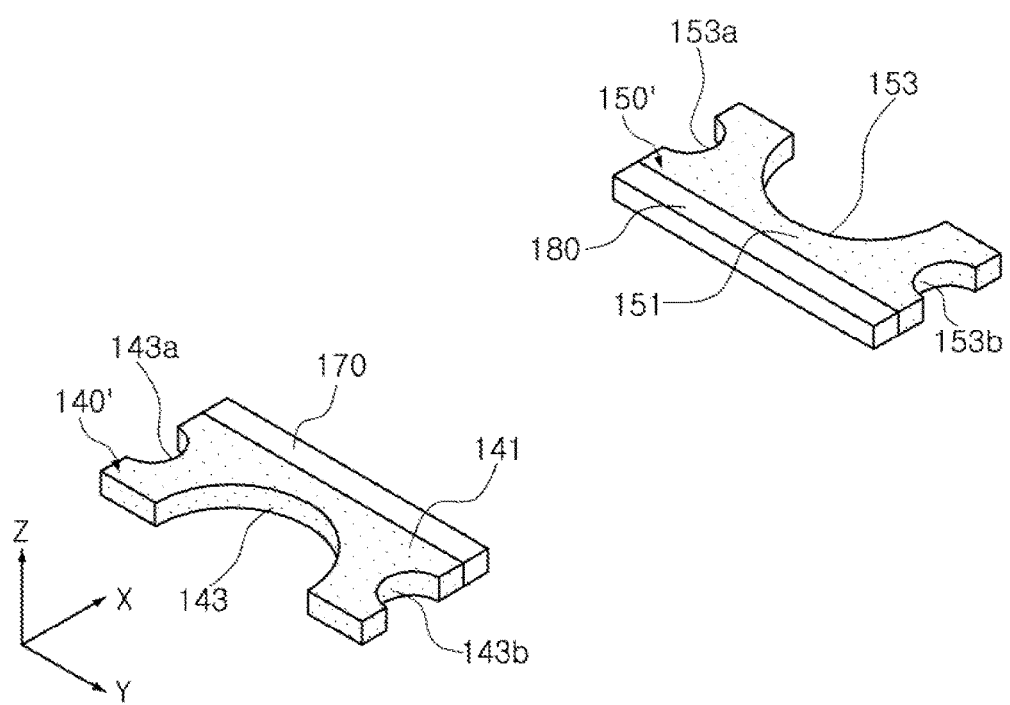

FIG. 8 illustrates a modified example of first and second cut portions in first and second connection terminals 140' and 150' according to the present disclosure.

Referring to FIG. 8, first cut portions 143a and 143b may be formed in opposite surfaces of the first connection terminal 140' in the Y direction to be open toward the fifth and sixth surfaces 5 and 6 of the capacitor body 110, respectively.

Although a pair of first cut portions, 143a and 143b, are illustrated and described in the present exemplary embodiment, the present disclosure is not limited thereto. Alternatively, the first cut portion may be formed in only one surface of the first connection terminal 140' to be opened toward only one of the fifth and sixth surfaces of the capacitor body 100.

In addition, second cut portions 153a and 153b may be formed in opposite surfaces of the second connection terminal 150' in the Y direction to be open toward the fifth and sixth surfaces 5 and 6 of the capacitor body 110, respectively.

Although a pair of second cut portions, 153a and 153b, are illustrated and described in the present exemplary embodiment, the present disclosure is not limited thereto. Alternatively, the second cut portion may only be formed in one surface of the second connection terminal 150' to be opened toward only one of the fifth and sixth surfaces of the capacitor body 110.

When the cut portions are further formed toward the Y direction of the capacitor body as described above, the cut portions may serve as solder pockets trapping solders in both of the X direction and the Y direction to suppress vibrations from being transferred to the circuit board in the X direction and the Y direction at the time of mounting the multilayer electronic component on the circuit board. Therefore, an acoustic noise reducing effect may be expected in all the directions of the multilayer electronic component.

In addition, since an amount of solders accommodated in the solder pockets is increased by the increased number of solder pockets, contact areas between the circuit board and connection terminals may be increased. Therefore, adhesion strength of the connection terminals may be further improved.

Figure 9:
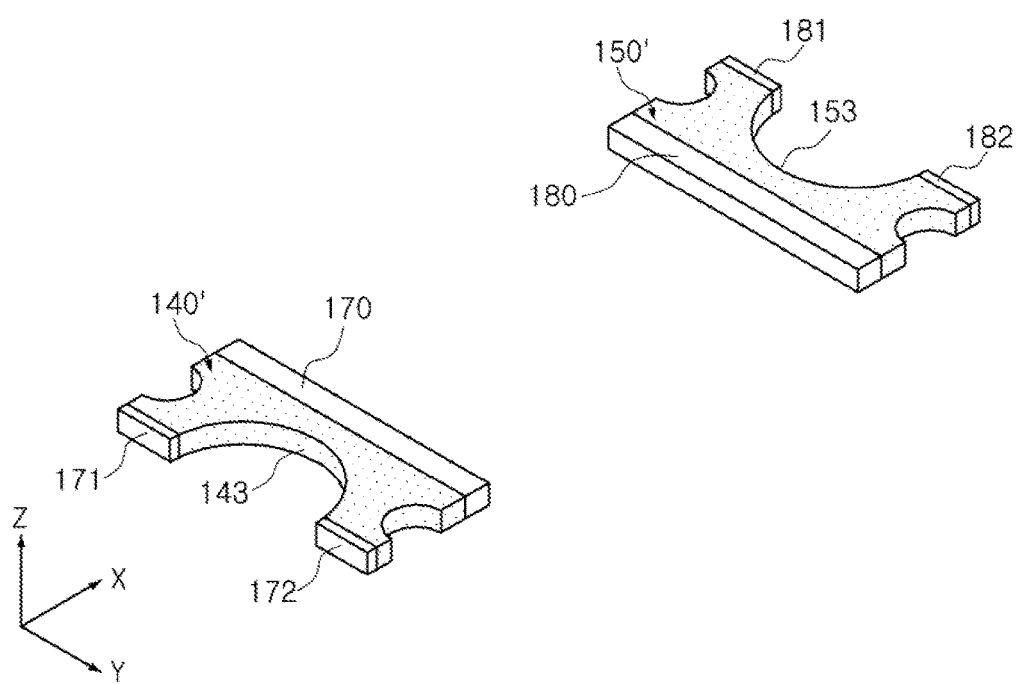

Referring to FIG. 9, a pair of first insulating portions may be further formed on both sides of a surface of the first connection terminal 140' of FIG. 8 toward the third surface 3 of the capacitor body 110 in the X direction with the first cut portion 143 interposed therebetween.

In addition, a pair of second insulating portions 181 and 182 may be further formed on both sides of a surface of the second connection terminal 150' toward the fourth surface 4 of the capacitor body 110 in the X direction with the second cut portion 153 interposed therebetween.

Figure 10:
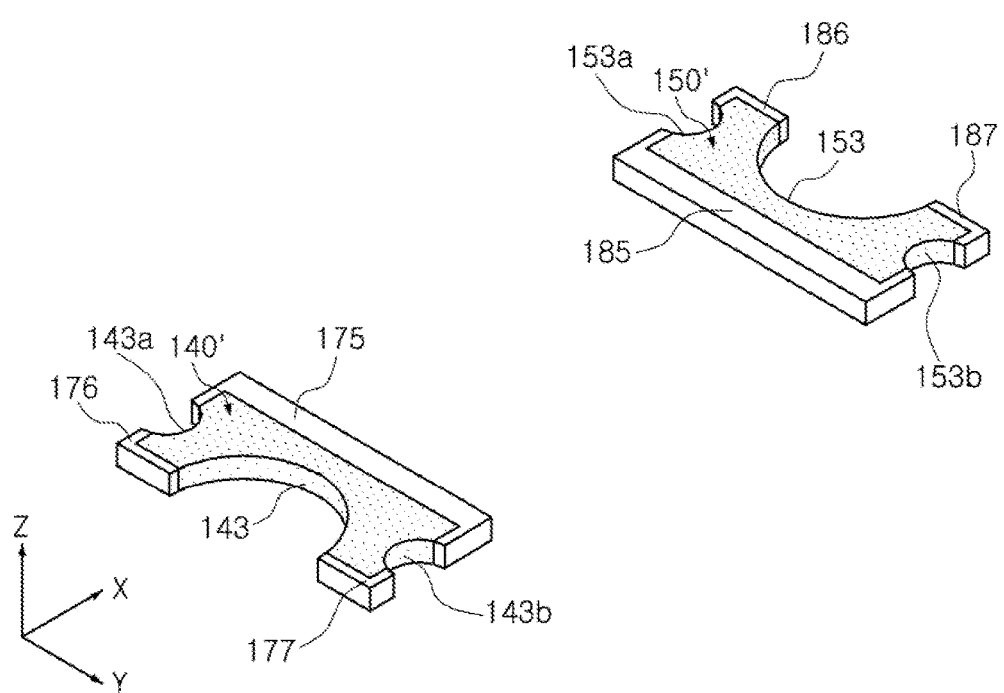

Referring to FIG. 10, a first insulating portion 175 may extend from a surface of the first connection terminal 140' of FIG. 8 toward the fourth surface 4 of the capacitor body 110 in the X direction to portions of opposite surfaces of the first connection terminal 140' in the Y direction, and first insulating portions 176 and 177 may extend from both sides of a surface of the first connection terminal 140' toward the third surface 3 of the capacitor body 110 in the X direction to portions of opposite surfaces of the first connection terminal 140' in the Y direction with the first cut portion 143 interposed therebetween.

That is, the first insulating portions 175, 176, and 177 may cover all circumferential surfaces of the first connection terminal 140' except for first cut portions 143, 143a, and 143b of the first connection terminal 140'.

In addition, a second insulating portion 185 may extend from a surface of the second connection terminal 150' of FIG. 8 toward the third surface 3 of the capacitor body 110 in the X direction to portions of opposite surfaces of the second connection terminal 150' in the Y direction, and second insulating portions 186 and 187 may extend from both sides of a surface of the second connection terminal 150' toward the fourth surface 4 of the capacitor body 110 in the X direction to portions of opposite surfaces of the second connection terminal 150' in the Y direction with the second cut portion 153 interposed therebetween.

That is, the second insulating portions 185, 186, and 187 may cover all circumferential surfaces of the second connection terminal 150', except for first cut portions 153, 153a, and 153b of the second connection terminal 150'.

Figure 11:
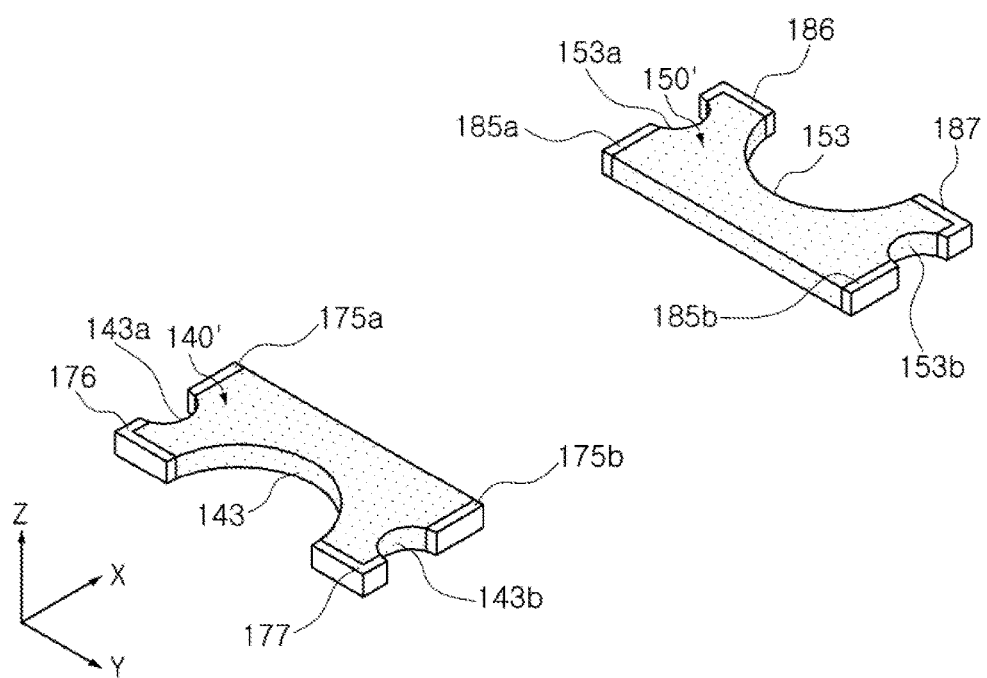

Referring to FIG. 11, first insulating portions 176 and 177 may extend from both sides of a surface of the first connection terminal 140' of FIG. 8 toward the third surface 3 of the capacitor body 110 in the X direction to portions of opposite surfaces of the first connection terminal 140' in the Y direction with the first cut portion 143 interposed therebetween, and first insulating portions 175a and 175b may be further formed on remaining portions of the first connection terminal 140' in the Y direction.

That is, the first insulating portions 176, 177, 175a, and 175b may cover surfaces of the first connection terminal 140' except for the first cut portions 143, 143a, and 143b and surfaces facing the first cut portions 143, 143a, and 143b among circumferential surfaces of the first connection terminal 140'.

In addition, second insulating portions 186 and 187 may extend from both sides of a surface of the second connection terminal 150' of FIG. 8 toward the fourth surface 4 of the capacitor body 110 in the X direction to portions of opposite surfaces of the second connection terminal 150' in the Y direction with the second cut portion 153 interposed therebetween, and second insulating portions 185a and 185b may be further formed on remaining portions of the second connection terminal 150' in the Y direction.

That is, the second insulating portions 186, 187, 185a, and 185b may cover surfaces of the second connection terminal 150' except for the second cut portions 153, 153a, and 153b and surfaces facing the first cut portions 153, 153a, and 153b among circumferential surfaces of the second connection terminal 150'.

Figure 12:
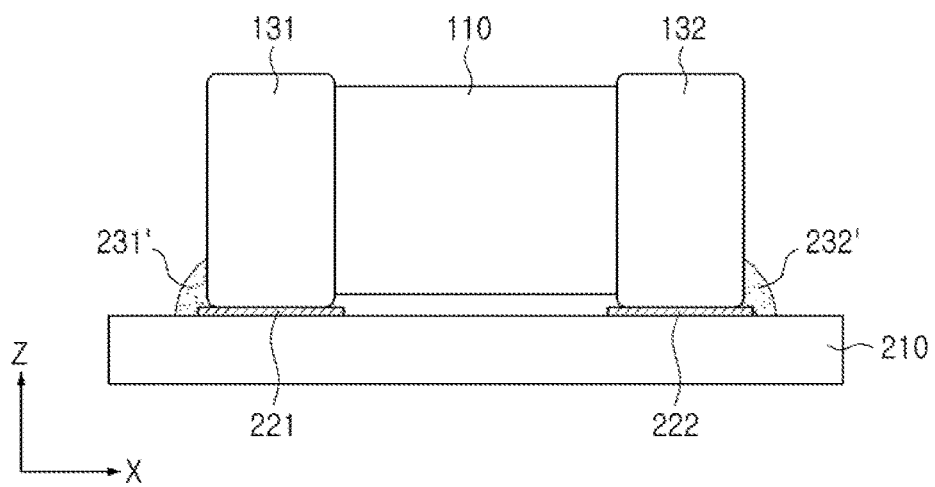
FIG. 12 is a schematic front view illustrating a state in which a multilayer capacitor is mounted on a circuit board without using connection terminals and insulating portions.
Figure 13:
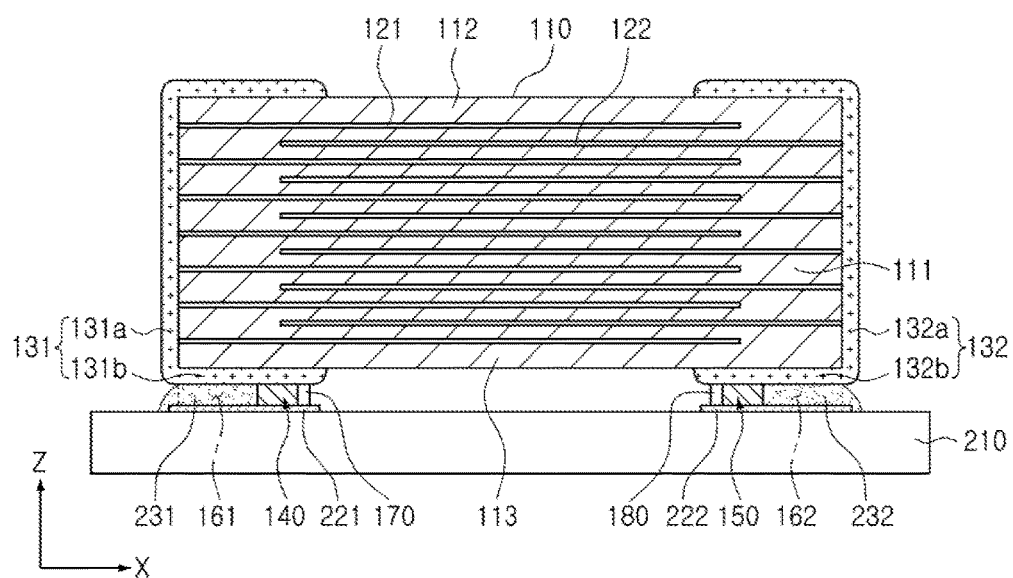
FIG. 13 is a schematic front view illustrating a state in which the multilayer electronic component according to an exemplary embodiment in the present disclosure is mounted on a circuit board.

FIG. 12 is a schematic front view illustrating a state in which a multilayer capacitor is mounted on a circuit board without using connection terminals and insulating portions, and FIG. 13 is a schematic front view illustrating a state in which the multilayer electronic component according to an exemplary embodiment in the present disclosure is mounted on a circuit board.

When voltages having different polarities are applied to the first and second external electrodes 131 and 132 formed on the multilayer electronic component 100 in a state in which the multilayer electronic component 100 is mounted on a circuit board 210, the capacitor body 110 may be expanded and contracted in the thickness direction due to an inverse piezoelectric effect of the dielectric layers 111, and both end portions of the first and second external electrodes 131 and 132 may be contracted and expanded as opposed to the expansion and the contraction of the capacitor body 110 in the thickness direction due to the Poisson effect.

Such a contraction and expansion may generate vibrations. In addition, the vibrations may be transferred from the first and second external electrodes 131 and 132 to the circuit board 210, and sound may thus be radiated from the circuit board 210, which becomes acoustic noise.

Referring to FIG. 12, solders 231' and 232' formed, respectively, between first and second external electrodes 131 and 132 of the multilayer capacitor and first and second electrode pads 221 and 222 formed on one surface of the circuit board 210 are formed at a predetermined height toward a second surface of a capacitor body 110, such that a large amount of vibrations generated by the multilayer capacitor may be transferred to the circuit board 210.

Referring to FIG. 13, a board having a multilayer electronic component according to the present exemplary embodiment may include the circuit board 210 having first and second electrode pads 211 and 222 disposed on one surface thereof and the multilayer electronic component 100 mounted on an upper surface of the circuit board 210 so that the second and fourth conductive patterns 142 and 152 of the first and second connection terminals 140 and 150 are connected to the first and second electrode pads 221 and 222, respectively.

Here, in the present exemplary embodiment, a case in which the multilayer electronic component 100 is mounted on the circuit board 210 by solders 231 and 232 is illustrated and described, but conductive pastes may be used instead of the solders, if necessary.

According to the present exemplary embodiment, the piezoelectric vibrations transferred to the circuit board through the first and second external electrodes 131 and 132 of the multilayer electronic component 100 may be absorbed through elasticity of the first and second connection terminals 140 and 150 including insulators formed of a soft material, and acoustic noise may thus be reduced.

Here, the first and second solder accommodating portions 161 and 162 provided by the first and second cut portions of the first and second connection terminals 140 and 150, respectively, may serve as the solder pockets that may trap the solders 231 and 232 on the first surface of the capacitor body 110.

In the present exemplary embodiment, portions of the first and second connection terminals 140 and 150 except for the first and second cut portions among the circumferential surfaces of the first and second connection terminals 140 and 150 may be formed of insulating surfaces, and the first and second insulating portions 170 and 180 may be disposed along circumferences of the first and second connection terminals 140 and 150, respectively, so as not to cover the first and second cut portions.

Therefore, the solders are not formed on the circumferential surfaces of the first and second connection terminals except for the first and second cut portions when the multilayer electronic component 100 is mounted on the circuit board 210, and the solders 231 and 232 may thus be more effectively trapped in the first and second solder accommodating portions 161 and 162, respectively. Therefore, formation of solder fillets toward the second surface of the capacitor body 110 may be suppressed.

Therefore, a piezoelectric vibration transfer path of the multilayer electronic component 100 may be blocked, and the solder fillets and a maximum displacement point in the capacitor body 110 may be spaced apart from each other to significantly improve an acoustic noise reducing effect of the multilayer electronic component 100 as compared to a structure of FIG. 12.

In addition, according to the present exemplary embodiment, a vibration amount of the piezoelectric vibrations of the multilayer electronic component transferred to the circuit board at an audio frequency within 20 kHz of the multilayer electronic component may be effectively suppressed by the acoustic noise reducing structure described above.

Therefore, high frequency vibrations of the multilayer electronic component may be reduced to prevent malfunctions of sensors that may be caused by high frequency vibrations in a high frequency region of 20 kHz or more of the multilayer electronic component in information technology (IT) or industry/electrical component fields and suppress accumulation of internal fatigue of the sensors due to vibrations for a long period of time.

As set forth above, according to the exemplary embodiments in the present disclosure, acoustic noise in an audio frequency region of 20 kHz or less and the high frequency vibrations in the high frequency region of 20 kHz or more of the multilayer electronic component may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
  a capacitor body including a plurality of dielectric layers and a plurality of first and second internal electrodes alternately disposed with respective dielectric layers interposed therebetween and having first and second surfaces opposing each other, third and fourth surfaces connected to the first and second surfaces and opposing each other, and fifth and sixth surfaces connected to the first and second surfaces, connected to the third and fourth surfaces, and opposing each other, one ends of the first and second internal electrodes being exposed through the third and fourth surfaces, respectively;
  first and second external electrodes including, respectively, first and second band portions disposed on the first surface of the capacitor body to be spaced apart from each other and first and second connected portions, respectively extending from the first and second band portions to the third and fourth surfaces of the capacitor body;
  first and second connection terminals formed of insulators and disposed on the first and second band portions, respectively; and
  first and second insulating portions disposed on at least some circumferential surfaces of the first and second connection terminals, respectively,
  wherein the first connection terminal includes a first conductive pattern formed on a surface thereof facing the first band portion, a second conductive pattern formed on a surface thereof opposing the surface on which the first conductive pattern is formed, a first cut portion formed in some circumferential surfaces thereof connecting the first and second conductive patterns to each other, and a first connection pattern formed on the first cut portion to electrically connect the first and second conductive patterns to each other, and
  the second connection terminal includes a third conductive pattern formed on a surface thereof facing the second band portion, a fourth conductive pattern formed on a surface thereof opposing the surface on which the third conductive pattern is formed, a second cut portion formed in some circumferential surfaces thereof connecting the third and fourth conductive patterns to each other, and a second connection pattern formed on the second cut portion to electrically connect the third and fourth conductive patterns to each other.

2. The multilayer electronic component of claim 1, wherein the first and second insulating portions are disposed so as not to cover the first and second cut portions, respectively.

3. The multilayer electronic component of claim 1, wherein areas of the first and third conductive patterns are smaller than those of the first and second band portions, respectively.

4. The multilayer electronic component of claim 1, wherein the first connection pattern is formed on all of the circumferential surfaces of the first connection terminal connecting the first and second conductive patterns to each other or some the circumferential surfaces of the first connection terminal including the first cut portion, and
  the second connection pattern is formed on all of the circumferential surfaces of the second connection terminal connecting the third and fourth conductive patterns to each other or some the circumferential surfaces of the second connection terminal including the second cut portion.

5. The multilayer electronic component of claim 1, wherein first and second solder accommodating portions are provided by the first and second cut portions on the first and second band portions, respectively.

6. The multilayer electronic component of claim 1, wherein the first and second cut portions are open toward the third and fourth surfaces of the capacitor body, respectively.

7. The multilayer electronic component of claim 6, wherein the first and second cut portions are further formed to be open toward at least one of the fifth and sixth surfaces of the capacitor body.

8. The multilayer electronic component of claim 6, wherein the first and second insulating portions are disposed on surfaces of the first and second connection terminals toward the fourth and third surfaces of the capacitor body, respectively.

9. The multilayer electronic component of claim 6, wherein the first and second insulating portions are disposed on surfaces of the first and second connection terminals toward the fifth and sixth surfaces of the capacitor body.

10. The multilayer electronic component of claim 6, wherein the first insulating portions are formed on both sides of a surface of the first connection terminal toward the third surface of the capacitor body with the first cut portion interposed therebetween, and
  the second insulating portions are formed on both sides of a surface of the second connection terminal toward the fourth surface of the capacitor body with the second cut portion interposed therebetween.

11. The multilayer electronic component of claim 1, wherein the first and second insulating portions are disposed on surfaces of the first and second connection terminals opposing the first and second cut portions, respectively.

12. A board having a multilayer electronic component, comprising:
  a circuit board having first and second electrode pads disposed on one surface thereof; and
  the multilayer electronic component of claim 1 mounted on the circuit board so that the second and fourth conductive patterns of the first and second connection terminals are connected to the first and second electrode pads, respectively.

13. The board of claim 12, further comprising:
a first solder filling a first solder pocket confined by the capacitor body, the first cut portion of the first connection terminal, and the circuit board, and
a second solder filling a second solder pocket confined by the capacitor body, the second cut portion of the second connection terminal, and the circuit board.

* * * * *